(12) United States Patent
Verraes

(10) Patent No.: US 10,643,041 B2
(45) Date of Patent: May 5, 2020

(54) METHOD FOR THE TAMPER-EVIDENT AND TRACEABLE MARKING OF AN ASSEMBLY OF TWO ELEMENTS

(71) Applicant: SAFRAN ELECTRONICS & DEFENSE, Boulogne Billancourt (FR)

(72) Inventor: Cédric Verraes, Boulogne Billancourt (FR)

(73) Assignee: SAFRAN ELECTRONICS & DEFENSE, Boulogne, Billancourt (FR)

( * ) Notice: Subject to any disclaimer, the term of this patent is extended or adjusted under 35 U.S.C. 154(b) by 0 days.

(21) Appl. No.: 16/309,740

(22) PCT Filed: Jun. 28, 2017

(86) PCT No.: PCT/EP2017/066056
§ 371 (c)(1),
(2) Date: Dec. 13, 2018

(87) PCT Pub. No.: WO2018/002176
PCT Pub. Date: Jan. 4, 2018

(65) Prior Publication Data
US 2019/0138773 A1    May 9, 2019

(30) Foreign Application Priority Data
Jun. 29, 2016   (FR) ...................................... 16 56080

(51) Int. Cl.
*G06K 19/077*    (2006.01)
*G06K 7/10*    (2006.01)
(Continued)

(52) U.S. Cl.
CPC ........ *G06K 7/10366* (2013.01); *F16B 1/0071* (2013.01); *F16B 39/021* (2013.01);
(Continued)

(58) Field of Classification Search
CPC ............ G06K 7/10366; G06K 19/0723; G06F 16/955; F16B 39/021; H05K 5/0208
See application file for complete search history.

(56) References Cited

U.S. PATENT DOCUMENTS 8,310,367 B1   11/2012   Vishwanath
9,483,674 B1 *   11/2016   Fink ................... G06K 7/10366
(Continued)

FOREIGN PATENT DOCUMENTS

EP    2 250 667 B1    4/2013
EP    3 020 528 A1    5/2016

OTHER PUBLICATIONS

Oct. 13, 2017 International Search Report issued in International Patent Application No. PCT/EP2017/066056.

*Primary Examiner* — Laura A Gudorf
(74) *Attorney, Agent, or Firm* — Oliff PLC; R. Brian Drozd

(57) ABSTRACT

The invention relates to a method for the tamper-evident and traceable marking of an assembly of a first element and a second element, the marking method comprising steps of assembling the first element and the second element, placing a radio tag marker on a first surface of the first element, the first surface being facing a second surface of the second element, and applying a first layer of locking varnish to a third surface, the third surface comprising the first surface and the second surface, in order to cover the marker, the first layer of locking varnish, once dried, guaranteeing that the marking is tamper-evident and the radio tag marker affording tracing of the marking.

9 Claims, 2 Drawing Sheets

(51) Int. Cl.
    *F16B 39/02*    (2006.01)
    *H05K 5/02*     (2006.01)
    *F16B 1/00*     (2006.01)
    *G06F 16/955*   (2019.01)
    *G06K 19/07*    (2006.01)

(52) U.S. Cl.
    CPC ....... *G06F 16/955* (2019.01); *G06K 19/0723* (2013.01); *G06K 19/07798* (2013.01); *H05K 5/0208* (2013.01)

(56) References Cited

U.S. PATENT DOCUMENTS

| | | | |
|---|---|---|---|
| 2002/0044063 A1* | 4/2002 | Blagin | F16B 41/005 340/665 |
| 2009/0227069 A1 | 9/2009 | Brun et al. | |
| 2011/0001237 A1 | 1/2011 | Brun et al. | |
| 2016/0136859 A1* | 5/2016 | Song | B29C 45/14819 411/82.1 |

* cited by examiner

METHOD FOR THE TAMPER-EVIDENT AND TRACEABLE MARKING OF AN ASSEMBLY OF TWO ELEMENTS

The present invention relates to the field of the assembly of elements. The invention relates more particularly to a method for the tamper-evident and traceable marking of an assembly of elements, that is to say a method guaranteeing that the marking is destroyed when the elements are disassembled and affording traceability of the marking.

In the engineering field, in particular that of the assembly of electronic elements, components or cards, using a locking varnish on assembly screws is known. A locking varnish is sometimes referred to as "sealing varnish", "locking glue" etc. The prime function of such a locking varnish is to prevent accidental unscrewing, for example by vibration, of the screws. Thus a locking varnish is for example a hardening glue, becoming breakable after drying. A glue of the acrylic varnish type, or a so-called "epoxy" glue or resin, can be used as a locking varnish. A product of the nail varnish type may even be used as a locking varnish. However, such a marking by a locking varnish is frequently used, mainly or in a supplementary fashion, for another function. Since the locking varnish becomes a breakable film after drying, the marking is then tamper-evident in that disassembling or removing the clamping screw destroys the marking. It is then impossible to disassemble the clamping screw without destroying the marking. Thus the application of a clamping varnish also frequently serves for clamping, control or security screws, the fixing of which must be able to be checked at any time in order to know whether the assembly has been modified. This is in particular the case in the field of electronics for replaceable modules (line-replaceable units, LRUs), which are not intended to be disassembled or removed by an unauthorised person, since removal may be the cause of loss of guarantee. The presence of locking varnish thus makes it possible to trace the dismantling and reassembly of replaceable modules. Typically, a manufacturer who recovers in after-sales service a replaceable module where the clamping screws have lost the locking varnish is entitled to ask whether said module had been improperly dismantled. It is however particularly easy, in the case of unauthorised disassembly, to reapply a layer of locking varnish at the time of reassembly. It is then almost impossible to prove unauthorised disassembly. More generally, this marking method by means of a locking varnish does not make it possible to know when assembly took place, or where the assembly took place, and even less who carried out the assembly.

It is desirable to overcome these drawbacks of the prior art.

The invention relates to a method for the tamper-evident and traceable marking of an assembly of a first element and a second element, the marking method comprising steps of assembling the first element and the second element, placing a marker of the radio tag type on a first surface of the first element, the first surface being next to a second surface of the second element, and applying a first layer of locking varnish to a third surface, the third surface comprising the first surface and the second surface, in order to cover the radio tag marker. Thus the first layer of locking varnish, once dry, guarantees that the marking is tamper-evident and that the radio tag marker enables the marking to be traced.

Advantageously, integrating a marker of the radio tag type (RFID tag—radio frequency identification tag) in the first layer of locking varnish makes it possible to obtain traceability of the marking. It then in fact becomes possible to use an electronic interrogation device such as a radio-tag reader in order to interrogate the marker remotely. From an identifier of the marker, and possibly the interrogation of a database, it is then possible to obtain information relating to the marking. Likewise, the absence of the marker makes it possible to overcome a drawback of the prior art by indicating that disassembly has taken place, even if a new layer of locking varnish, without a marker, has been applied in replacement for the first layer of locking varnish destroyed. Placing the marker before applying the first layer of locking varnish advantageously makes it possible to best choose the position of the marker on the first element and to facilitate the covering of the marker by the first layer of locking varnish. Covering the marker makes it possible both to conceal the existence thereof by making it invisible and to protect it from any impact.

According to a supplementary embodiment of the invention, the step of applying the first layer of locking varnish to the third surface is carried out before the step of placing the marker on the first surface and the step of placing the marker on the first surface comprises a step of placing the marker in the locking varnish so that the marker is covered by the locking varnish.

Advantageously, applying the first layer of locking varnish affords facilitated placement of the marker, which is then bonded in the first layer of locking varnish at the time of application.

According to a supplementary embodiment of the invention, the step of applying the locking varnish to the third surface comprising the first surface is carried out before the step of placing the marker on the first surface, and the step of placing the marker on the first surface comprises a step of placing the marker in the locking varnish. The method comprises a supplementary step of applying a second layer of locking varnish to the third surface in order to cover the marker.

Advantageously, applying a first layer of locking varnish before placing the marker and then next applying a second layer of locking varnish makes it possible both to facilitate the placing of the marker, which is bonded by the first layer of locking varnish, and covering thereof by the second layer of locking varnish.

According to a supplementary embodiment of the invention, the marker being included in a wire, placing the marker to placing the wire.

Advantageously, the marker is included in a wire, which facilitates gripping thereof by a user of the method. This also in particular affords easier implementation of the method by a tool, the wire comprising the marker being able to be uncoiled for implementation of the repetitive method.

According to a supplementary embodiment of the invention, the method comprises the additional steps of determining at least one value of a first parameter relating to the step of assembly and updating of a database, the value of the first parameter being associated in said database with a first item of information associated with the marker of the radio tag type.

Advantageously, a database is kept up to date, the database comprising values of parameters recorded in association with an item of information associated with a marker, such as an identifier. Thus it is possible to record, in association with the identifier of the marker included in the marking, a value such as a date of assembly or a serial number corresponding to an item of equipment in which the assembly is carried out.

According to one embodiment of the invention, the tamper-evident and traceable marking method comprises additional steps of interrogating a marking by means of an electronic interrogation device in order to find a value of a third parameter recorded in a memory of a marker of the radio tag type and to find in the database at least one second item of information associated with the value of the third parameter.

Advantageously, it is then possible to interrogate a marking with an electronic interrogation device in order to find a value of a parameter recorded in a memory of a marker, whether it be a write memory or not. It is then possible to find, in a database, information recorded in association with the value of the parameter found.

According to a supplementary embodiment of the invention, the radio tag marker comprising a write memory, the method comprises additional steps of determining at least one value of a parameter read at the step of assembling and recording in the write memory at least the value of the parameter.

Advantageously, a value of a parameter related to the assembly step is recorded in a memory of the marker. The parameter may correspond to the date of implementation of the method, to a tightening torque used during the assembly step, to an identifier of a maintenance centre implementing the method, an identifier of a replaceable module in which the elements are integrated, to an identifier of the marker used or any other parameter. It is then possible to use an electronic interrogation device such as a radio-tag reader for reading the value recorded in the marker at any time.

The invention also relates to a device comprising an assembly of a first element and a second element, the assembly being marked by a tamper-evident and traceable marking comprising at least one marker of the radio tag type integrated in at least one layer of locking varnish.

According to a supplementary embodiment of the invention, the radio-tag marker is included in a wire.

According to a supplementary embodiment of the invention, the radio tag marker comprises a write memory, at least one value of a parameter related to the assembly operation being recorded in the write memory.

The features of the invention mentioned above, as well as others, will emerge more clearly from a reading of the following description of an example embodiment, said description being given in relation to the accompanying drawings, among which:

Figure 1:
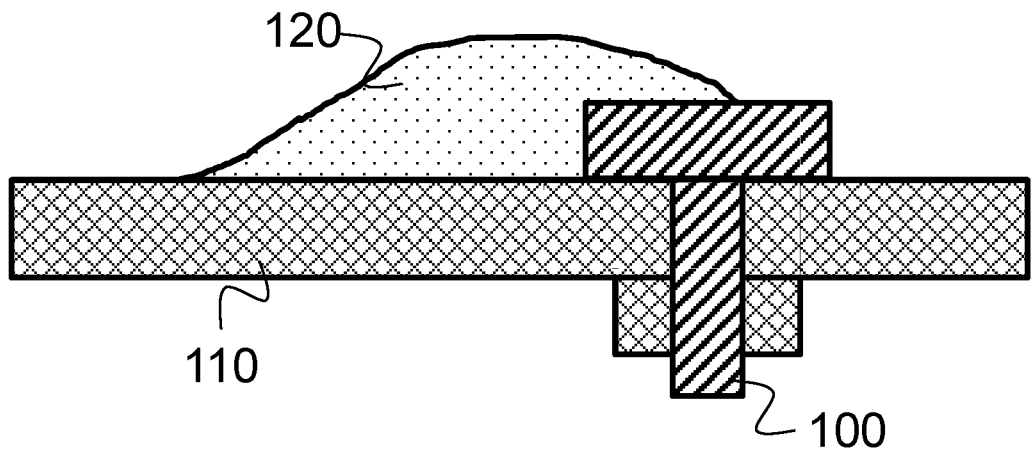
FIG. 1 illustrates schematically a tamper-evident marking by means of a locking varnish of the assembly of two elements according to a technique known from the prior art.

FIG. 1 illustrates schematically a tamper-evident marking by means of a locking varnish of the assembly of two elements according to a technique known from the prior art. In this example, a first element, a screw 100, is assembled, here screwed, in a threaded hole of a second element 110, for example a wall, chassis, housing or electronic card of a replaceable module. Once the screw 100 is assembled with the element 110, for example a chassis 110, a layer of locking varnish 120 is applied to a surface comprising at least part of a surface of the screw 100 and of a surface of the chassis 110. The layer of locking varnish is typically applied by means of a brush. Once applied, the locking varnish dries and actually secures together the screw 100 and the chassis 110. The fact that the surface of application of the locking varnish comprises at least part of a surface of the screw 100 and at least part of the surface of the chassis 110 next to guarantees that the screw 100 cannot be moved, unscrewed or disassembled without the varnish then being destroyed. This connection of the first element, the screw 100, and the second element, the chassis 110, affords a first locking function, here with respect to rotation, and hence the names "locking varnish" and "sealing varnish" used indifferently. A locking varnish must therefore have sufficient strength to afford real locking of the elements one with the other, without being too strong to then prevent any disassembly. A different strength of the locking varnish may be chosen depending on whether it is wished to be able to disassemble or dismantle the elements solely by hand force or by means of a dismantling tool. A different strength of the locking varnish may also be chosen depending on the stresses to which the assembly is subjected, for example vibration, forces, etc. The layer of locking varnish 120 applied also has the function of marking the assembly of the first element, the screw 100 and the second element 110, indicating for example that the assembly has been checked, or affording more simply easy and rapid viewing of the assembly. The fact that disassembling the screw 100 requires the destruction of the layer 120 of locking varnish is also used for a function of tracing disassemblies. Tamper-evident marking is spoken of since the marking is necessarily destroyed during disassembly of the elements, without any particular action being performed apart from the very action of disassembly. The traceability offered by this type of marking is reduced solely to the presence or absence of marking.

Figure 2:
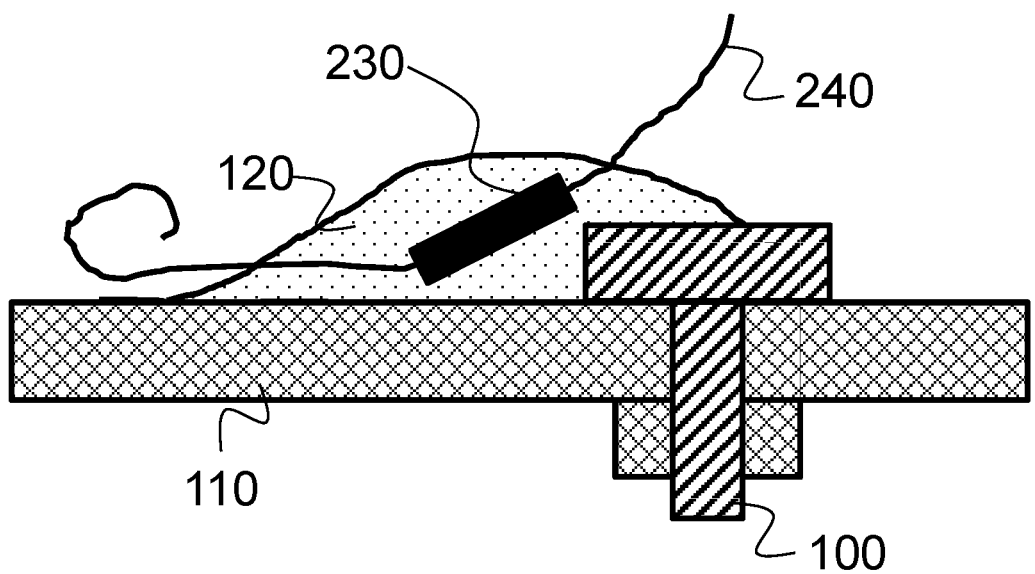
FIG. 2 illustrates schematically a tamper-evident and traceable marking of the assembly of two elements according to an embodiment of the invention.

FIG. 2 illustrates schematically a tamper-evident and traceable marking of the assembly of two elements according to an embodiment of the invention. The tamper-evident and traceable marking illustrated in FIG. 2 is distinguished from the previous marking illustrated in FIG. 1 by the presence, within the layer of locking varnish 120, of a marker of the radio tag type 230 (RFID tag, radio frequency identification tag). In other words, at least one marker of the radio tag 230 type is integrated in at least one layer of a locking varnish 120. According to an embodiment of the invention illustrated in the present FIG. 2, the marker 230 is included in a wire 240. The marker 230 may not be included in a wire 240. Gripping and manipulation of the marker 230 is facilitated when it is included in a wire 240. The presence of the marker 230 may be indicated in the wire 240 by a trace of colour for example. The marker 230 included in the wire 240 may correspond to the "E-Thread®" technology offered by the company Primo1D and described in the European patent reference EP 2250667 published on 24 Apr. 2013.

Possibly, the marker 230 may belong to one of the five classes of marker defined below:
    class 0 and class 1: read-only so-called "passive" marker 230 (only the unique identifier of the marker 230 is readable),
    class 2: so-called "passive" marker 230 with additional functions (the marker 230 comprises a memory, referred to as a write memory, said memory being able to be written);
    class 3: so-called "passive" marker 230 comprising a battery, said battery supplying for example a sensor included in the marker 230,
    class 4: so-called "active" marker 230 (a communication can be established between the marker 230 and the so-called "interrogating" electronic interrogation device).

The so-called "passive" markers 230 function through a principle of retromodulation of a wave emitted by an electronic interrogation device or "interrogator". The so-called "active" markers 230 comprise a radio-frequency emitter and a battery for supplying same.

According to an embodiment of the invention, the marker 230 comprises a unique identifier associated with the marker 230 (class 0 and 1). According to another embodiment, the marker 230 (classes 2, 3 and 4) may comprise other parameters recorded in the write memory of the marker 230.

Any other technology for obtaining a remotely interrogatable marker 230, for example by radio-frequency wave, can be used. The marker 230 can thus use a short-distance radio communication technology of the NFC (near field communication) or ZigBee® type.

Figure 3:
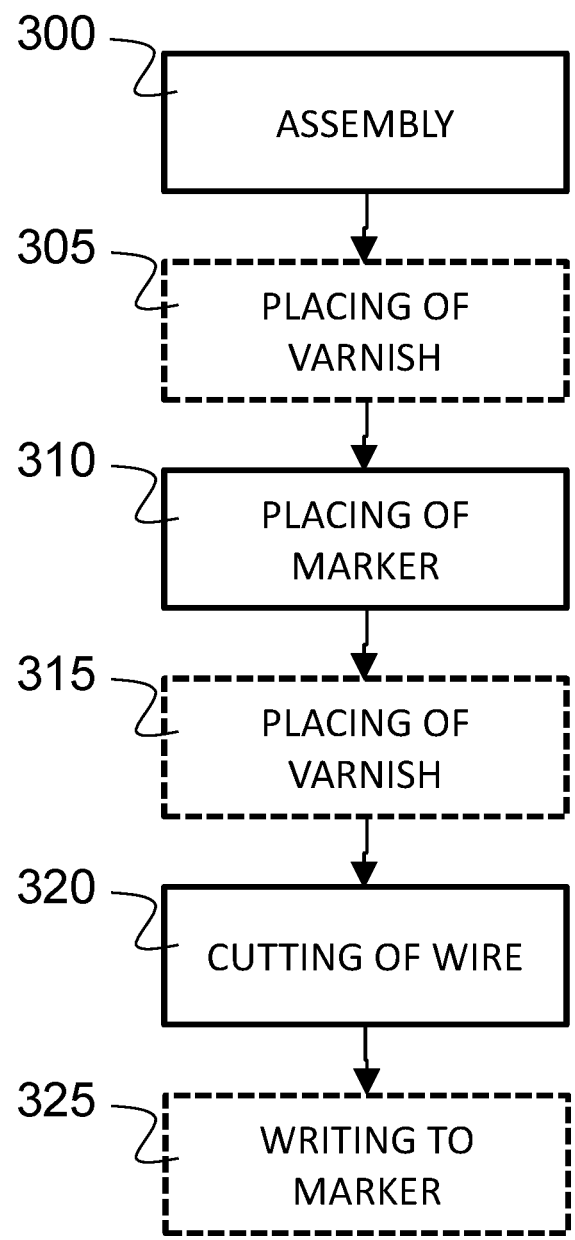
FIG. 3 illustrates schematically a method of tamper-evident and traceable marking of an assembly of a first element and of a second element according to an embodiment of the invention.

FIG. 3 illustrates schematically a method for the tamper-evident and traceable marking of an assembly of a first element and a second element according to an embodiment of the invention. The first element is for example the screw 100 and the second element the element 110, both illustrated in FIG. 1 and FIG. 2. The present method is described when it is performed by an operator, but the present method may be implemented by a machine tool.

In a first step 300, the operator assembles the first element, for example the screw 100, and the second element, for example a chassis 110. The assembly corresponds in the example given to the screwing of the screw 100 into a threaded hole in the chassis 110. The assembly may be done according to a particular value of a parameter such as a tightening torque.

According to one embodiment of the invention, in a step 305, the operator applies a first layer of locking varnish to a surface comprising a part of the screw 100 and of the chassis 110. In other words, the operator applies the first layer of locking varnish to a surface comprising a first surface of the screw 100 and a second surface of the chassis 110 facing the first surface.

In a step 310, the operator places a marker 230 of the radio tag type.

If step 305 has not been performed, that is to say if no layer of locking varnish has previously been applied, the operator places the marker 230 of the radio tag type on the first surface of the screw 100, the first surface being facing the second surface of the chassis 110.

If step 305 has been performed, that is to say if a first layer of locking varnish has previously been applied, the operator places the marker 230 in the first layer of locking varnish. Should no other layer of locking varnish be applied thereafter, the operator places the marker 230 in the first layer of locking varnish so that the marker 230 is covered by the locking varnish.

If the marker 230 is included in a wire 240, placing the marker 230 corresponding to placing the wire 240 so that the part of the wire 240 comprising the marker 230 is on the first surface of the screw 100 or in the first layer of locking varnish previously applied.

According to one embodiment of the invention, in a step 315, the operator applies a second layer of locking varnish to the third surface in order to cover the marker 230.

According to one embodiment of the invention, only one of the steps 305 and 315 is performed. According to an alternative embodiment of the invention, the two steps 305 and 315 are performed. The layer of locking varnish 120 illustrated in FIGS. 1 and 2 therefore corresponds to the first layer of locking varnish applied during step 305, to the second layer of locking varnish applied during step 315 or to both these layers of locking varnish, the second layer being applied on top of the first layer.

According to one embodiment of the invention, in a step 320, if the marker 230 is included in a wire 240, the operator can cut the ends of the wire projecting from the layer or layers of locking varnish applied. This improves the discreetness of the marker 230 and conceals it. This also prevents the marker 230 being removed by pulling on one end of the wire 240.

If the marker 230 comprises a write memory (for example a marker 230 of class 2, 3 or 4), a step 325 may be performed. In step 325, the operator records at least one value of a parameter in the write memory of the marker 230. More precisely, the operator performs the recording action by means of an electronic interrogation device referred to as an "interrogator", said electronic device allowing the interrogation of and writing to the write memory. Such an electronic interrogation device is also referred to as an "RFID reader" or an "RFID scanner".

The parameter recorded may correspond to:
  a date, for example the date corresponding to the fitting of the marking or to the date of end of guarantee,
  information related to the assembly step, for example a tightening torque of the screw 100,
  an identifier for identifying for example the operator or the maintenance centre,
  an identifier such as a serial number, for example corresponding to the chassis 110, etc.

According to one embodiment of the invention, the information recorded on the write memory is encrypted. The encryption may be done by the electronic interrogation device known as an "interrogator" or by the marker 230.

According to one embodiment, an additional step of updating a database is performed. The database is updated by associating at least one item of information in said database with an item of information such as the identification of the marker. Thus the identifier of the marker may be associated with information such as a date, corresponding for example to the assembly date, to a maintenance centre, corresponding to the maintenance centre that performed the assembly, or to an identifier of a chassis or of a part, for example a serial number.

Is it thus possible, subsequently, by interrogating by means of an electronic interrogation device, to attempt to find an identifier of a marking. If no identifier, or more generally if no information, is found during the step of interrogating the marking, this means then that the marking does not comprise a marker. This is an indication that the original marking has been destroyed. This reveals a probable dismantling and then reassembly of the assembly, and then of a new marking carried out without integrating a marker, which probably indicates unauthorised dismantling and an attempt at falsification.

If on the contrary an identifier is found, it is then possible to conclude that the assembly has not been dismantled and to interrogate the database with this identifier in order to find any information recorded in association with the identifier.

The invention also relates to a device comprising an assembly of elements marked by a tamper-evident and traceable marking as obtained for example by the previously described method. Thus the invention relates to a device comprising an assembly of a first element 100 and a second element 110, the assembly being marked by a tamper-evident and traceable marking comprising at least one marker 230 of the radio tag type integrated in at least one layer of locking varnish. According to one embodiment of the invention, the radio tag marker 230 is included in a wire 240. According to a supplementary embodiment of the invention, the radio tag marker 230 comprises a write memory, at least one value of a parameter relating to the assembly operation being recorded in the write memory. Thus it is possible, by using an electronic interrogation device suited to the marker 230, to read a parameter relating to the assembly operation. Such a parameter may be an assembly date, an assembly place or for example a serial number corresponding to the device or to the elements assembled.

The invention claimed is:

1. A method for tamper-evident and traceable marking of an assembly of a first element and a second element, the marking method comprising the steps of:
   assembling the first element and the second element, the first element being a screw and the second element being a chassis,
   placing a marker of a radio tag type separated from the first and second elements, on an outside surface of the first element, called first surface, the first surface being next to an outside surface of the second element, called second surface, and
   applying a first layer of locking varnish to a third surface in order to cover the marker, the third surface comprising the first surface and the second surface, the first layer of locking varnish, once dried, guaranteeing that the marking will be tamper-evident, the radio tag marker allowing tracing of the marking, and the method comprising the following steps of:
   determining at least one value of a first parameter relating to the assembly step,
   updating a database, the value of the first parameter being associated in said database with a first item of information associated with the radio tag marker wherein the marker is mechanically attached to the first surface and to the second surface directly via the first layer of locking varnish such that when the first element is separated from the second element, the marker is removed from the third surface thereby allowing the first element to be detected as being separated from the second surface and wherein the marker of the radio tag type is configured to be interrogated by an electronic interrogation device to attempt to find an identifier of a marking in order to determine whether an unauthorized disassembly and reassembly of the first element and the second element occurred.

2. The tamper-evident and traceable marking method according to claim 1, wherein:
   the step of applying the first layer of locking varnish to the third surface is performed before the step of placing the radio tag marker on the first surface, and
   the step of placing the radio tag marker on the first surface comprising a step of placing the marker in the locking varnish so that the radio tag marker is covered by the locking varnish.

3. The tamper-evident and traceable marking method according to claim 1, wherein:
   the step of applying the locking varnish to the third surface comprising the first surface is performed before the step of placing the radio tag marker on the first surface, the step of placing the marker on the first surface comprises a step of placing the radio tag marker in the locking varnish, and the method comprising an additional step of:
   applying a second layer of locking varnish to the third surface in order to cover the radio tag marker.

4. The tamper-evident and traceable marking method according to claim 3, the radio tag marker being included in a wire, wherein placing the radio tag marker corresponds to placing the wire.

5. The tamper-evident and traceable marking method according to claim 4, wherein the method comprises additional steps of:
   interrogating a marking by means of said electronic interrogation device in order to find a value of a third parameter recorded in a memory of a radio tag marker, and
   finding in the database at least one second item of information associated with the value of the third parameter.

6. The tamper-evident and traceable marking method according to claim 1, the radio tag marker comprising a write memory, wherein the method comprises additional steps of:
   determining at least one value of a second parameter relating to the assembly step,
   recording in the write memory of the radio tag marker at least the value of the second parameter.

7. A device comprising an assembly of a first element and a second element, the first element being a screw and the second element being a chassis, the assembly being marked by tamper-evident and traceable marking comprising at least one radio tag marker integrated in a first layer of locking varnish, the marker of a radio tag type being placed separated from the first and second elements, on an outside surface of the first element, called first surface, the first surface being next to an outside surface of the second element, called second surface, the first layer of locking varnish being applied to a third surface in order to cover the marker, the third surface comprising the first surface and the second surface, wherein the marker is mechanically attached to the first surface and to the second surface directly via the first layer of locking varnish such that when the first element is separated from the second element, the marker is removed from the third surface thereby allowing the first element to be detected as being separated from the second surface and wherein the radio tag marker is configured to be interrogated by an electronic interrogation device to attempt to find an identifier of a marking in order to determine whether an unauthorized disassembly and reassembly of the first element and the second element occurred.

8. The device according to claim 7, the radio tag marker being included in a wire.

9. The device according to claim 7, the radio tag marker comprising a write memory, at least one value of a parameter relating to the assembly operation being recorded in the write memory.

* * * * *